US006593181B2

(12) United States Patent
Laibowitz et al.

(10) Patent No.: US 6,593,181 B2
(45) Date of Patent: Jul. 15, 2003

(54) TAILORED INSULATOR PROPERTIES FOR DEVICES

(75) Inventors: Robert Benjamin Laibowitz, Cortlandt Manor, NY (US); John David Baniecki, Kanagawa (JP); Johannes Georg Bednorz, Wolfhausen (CH); Jean-Pierre A. Locquet, Horgen (CH)

(73) Assignee: International Business Machines Corporation, Armonk, NY (US)

( * ) Notice: Subject to any disclaimer, the term of this patent is extended or adjusted under 35 U.S.C. 154(b) by 67 days.

(21) Appl. No.: 09/838,870

(22) Filed: Apr. 20, 2001

(65) Prior Publication Data

US 2002/0153549 A1 Oct. 24, 2002

(51) Int. Cl.$^7$ .......................................... H01L 21/8242
(52) U.S. Cl. ...................... 438/239; 438/240; 438/241; 438/253; 438/381; 438/396; 438/393; 438/3; 438/250; 257/300; 257/303
(58) Field of Search ................. 438/278, 240, 438/3, 396, 386, 393, 253, 627, 381, 239, 241; 361/305; 257/298, 300; 359/589

(56) References Cited

U.S. PATENT DOCUMENTS

| 5,726,805 | A | * | 3/1998 | Kaushik et al. ............. 359/589 |
| 5,940,677 | A | * | 8/1999 | Yamauchi et al. ............ 438/3 |
| 6,128,178 | A | * | 10/2000 | Newns ....................... 361/305 |
| 6,130,124 | A | * | 10/2000 | Lee ........................... 438/240 |
| 6,165,834 | A | * | 12/2000 | Agarwal et al. ............. 438/240 |
| 6,172,385 | B1 | | 1/2001 | Duncombe .................. 257/295 |
| 6,225,668 | B1 | | 5/2001 | Shindo ....................... 257/368 |
| 6,255,122 | B1 | * | 7/2001 | Duncombe et al. ............ 438/3 |
| 6,255,186 | B1 | * | 7/2001 | Al-Shareef et al. ......... 438/396 |
| 6,300,239 | B1 | | 10/2001 | Ono ............................ 438/633 |

OTHER PUBLICATIONS

C. Zhou et al. Intrinsic dead layer effect and the performance of ferroelectric thin film capacitors, J. Appl. Physics, vol. 82 (6) Sep. 15, 1997.*
S. Wolf and R. N. Tauber, Silicon Processing for the VLSI Era, vol. 1, pp. 295–308 and 321.*

* cited by examiner

Primary Examiner—Caridao Everhart
Assistant Examiner—Belur V Keshavan
(74) Attorney, Agent, or Firm—George Sai-Halasz; Robert M. Trepp

(57) ABSTRACT

A method for tailoring properties of high k thin layer perovskite materials, and devices comprising such insulators are herein presented. The method comprise the steps of, first, substantially completing the manufacture of a device, which device contains the high k insulator in a polycrystalline form. The device, such as a capacitor, or an FET, went through the typically high temperature manufacturing process of a fabrication line. In the next step, the device is in situ ion implanted with such a dose and energy to convert a fraction of the polycrystalline material into an amorphous material state, hereby tailoring the properties of the insulator. The fraction of polycrystalline material converted to amorphous material might be 1. This process can be applied to many electronic devices and some optical devices. The process results in novel perovskite thin layer materials and novel devices fabricated with such materials.

53 Claims, 5 Drawing Sheets

TAILORED INSULATOR PROPERTIES FOR DEVICES

FIELD OF THE INVENTION

The present invention relates to insulating layers consisting of a mixture of crystalline and amorphous material states, and to devices that use such insulators. More specifically, this invention teaches a method for using ion implantation to amorphize insulators, thereby tailoring the insulator properties to optimize device performance. The invention also teaches the resulting mixed crystalline/amorphous perovskite materials, and the devices made with such materials.

BACKGROUND OF THE INVENTION

Insulating layers in the thickness range of 1 to 1000 nm have found wide use in integrated circuits. Almost all devices that make up today's integrated circuits, such as field effect transistors (FET), capacitors, decoupling capacitors, filters, and varactors, to name a few, are critically dependent on insulator properties. Also, one finds on a typical chip many non-device components with needs regarding dielectric properties of insulators that may be just as specific as those guiding the considerations for devices. Such might be the case for some passivation layers. When the circuits and the corresponding dielectrics are built on silicon wafers, the insulators of choice, almost universally, have been the oxides and nitrides of Si. These materials have relatively low dielectric constants, about 4 and 7 respectively. As circuits shrink and become more specialized, dielectrics with high dielectric constants (high k materials) also have become desirable alternatives. For instance, the need for high k materials is apparent for the case of the storage node of a DRAM cell. The cell needs high capacitance to store as much charge as possible, and there is a limit how thin the insulating layer can be made. Using a thin layer of $SiO_2$ as an example in a capacitor in a DRAM memory circuit, there is a limit to the minimum thickness that the $SiO_2$ can have. For example, at thicknesses below about 3 nm tunneling current starts to come into play, resulting in leaky capacitors, which are unable to store charge for sufficiently long times. The gate insulator in the FET's encounters similar limitations as miniaturization progresses. High k materials help miniaturization in general, since the area of any device can be made smaller if capacitance per unit area increases.

SUMMARY OF THE INVENTION

The object of the present invention is to overcome the deficiencies described, which result from the use of low dielectric constant insulating materials. The central idea of the present invention is to replace such materials by suitably tailored high k materials, and specifically how to achieve the exact desired value of dielectric constant with appropriate leakage current and stress/strain parameters.

If one can make use of a high k perovskite material, such as barium strontium titanate (BSTO), which can have a dielectric constant of about 300 at 30 nm thickness, one obtains high capacitance with low leakage due to the thickness of the film. Similar arguments are valid for many other capacitor dielectrics applications as well, where thicker films with less defects can be used when the dielectric constant is suitably high. However, often the properties of such high k dielectrics, apart of the high value of the dielectric, are not otherwise optimized for the intended use.

The as-deposition material structure of the typical perovskite is generally crystalline, almost exclusively polycrystalline. The object of this invention is to teach that after the manufacture of the device—incorporating the insulator—has already been essentially completed, one can in-situ controllably vary the dielectric constant of the insulator material. This is done by using ion implantation to convert the crystalline material of the insulator in part, or fully, to an amorphous material state. The amorphous material has a very different dielectric constant value than the crystalline material. A mixture of the crystalline and amorphous material exhibits a dielectric constant value which is in the range between the values of the fully crystalline and the fully amorphous material states. In this manner, depending on what fraction of the insulator is converted into the amorphous state, one can smoothly vary the dielectric constant of the final material from a value corresponding to the as deposited crystalline state, all the way to the dielectric value of the fully amorphous material. The parameters of the ion implanting, such as implant species, implant energy, implant dose, or possibly several species in combination at several energies and several doses, are chosen to achieve, or tailor, the insulator properties in a manner that the insulator properties match the operational requirements of the device.

It is important to emphasize the advantage that the conversion to amorphous material is done after the device manufacture is substantially completed. The dielectric at this stage is usually covered by a conducting electrode and possibly other layers commonly used in integrated circuit technology. Thus, for instance, in an array of capacitors if some, or even one of the capacitors has a very different value from the rest, it is possible to trim that capacitor even after the fabrication is complete.

It important as well, that while one is adjusting the dielectric constant by ion implantation, one can also get a lowering of the leakage current, and a relieving stress and strain at layer interfaces.

Different values of dielectric constant are needed for different applications. DRAM capacitors need the highest k for charge storage and the lowest leakage for charge retention. A 1 GBit DRAM will have $10^9$ storage nodes with capacitors storing the charge at each node. Uniformity among the array is also desirable. FET gate dielectrics need not have such high dielectric constants and the leakage currents can be much higher. However, low leakage is also desirable for FETS, particularly for portable applications. Filters, decoupling capacitors, and varactors need to have dielectric values somewhere in between the values used for DRAMS and for gates. Thus, in modern integrated circuitry applications, it will be necessary to have available for circuit designers materials in thin layer form whose dielectric constant can be controllably varied.

In another embodiment the possibility to vary the dielectric constant of an insulator in a broad range, with the spatial precision of ion implantation, lends itself for use in optical devices, such as dielectric mirrors, filters and gratings.

We have shown that the electrical properties of perovskite materials in thin film form can be controllably altered by amorphizing the material with such implant species as Cr, Cl, Ti, Mn, and Nb. Also lighter ion species like F, H and D have their useful points, such as deeper penetration at lower energies.

Typical perovskite materials for use in this invention include strontium titanate (STO), barium titanate(BTO), and the compound barium strontium titanate (BSTO). Similar materials of use include lead titanate, lead bismuth titanate, strontium bismuth titanate and those materials in which Nb and Ta atoms substitute for the titanium atom. Typically the perovskite formula is ABO where for the case of STO A=Sr, B=Ti and O=O. While for BSTO, A=a combination of Ba and Sr, typically given by a ratio x whereby A=Ba(1−x)Sr(x). In the experimental descriptions that follow BSTO is used as the prime embodiment, with x=0.3

The as deposited thin layers of perovskite materials are either fully crystalline or fully amorphous. Which of the two states one ends up with depends on the mode of deposition, and importantly, on the temperature. One obtains as deposited amorphous material only at low temperatures, typically below few hundred degrees C. The perovskite layers that one deposits during the fabrication process of integrated circuits, where temperatures range in the 1000° C., are crystalline. Consequently the mixed crystalline/amorphous perovskite layers in integrated circuits are novel materials by themselves. The devices made with these mixed state perovskite insulators are novel devices.

The general invention which is directed toward any device in need of special insulators, will be now discussed in detail for a few selected embodiments.

BRIEF DESCRIPTION OF THE DRAWINGS

These and other features of the present invention will become apparent from the accompanying detailed description and drawings.

DETAILED DESCRIPTION OF THE INVENTION

Figure 1:
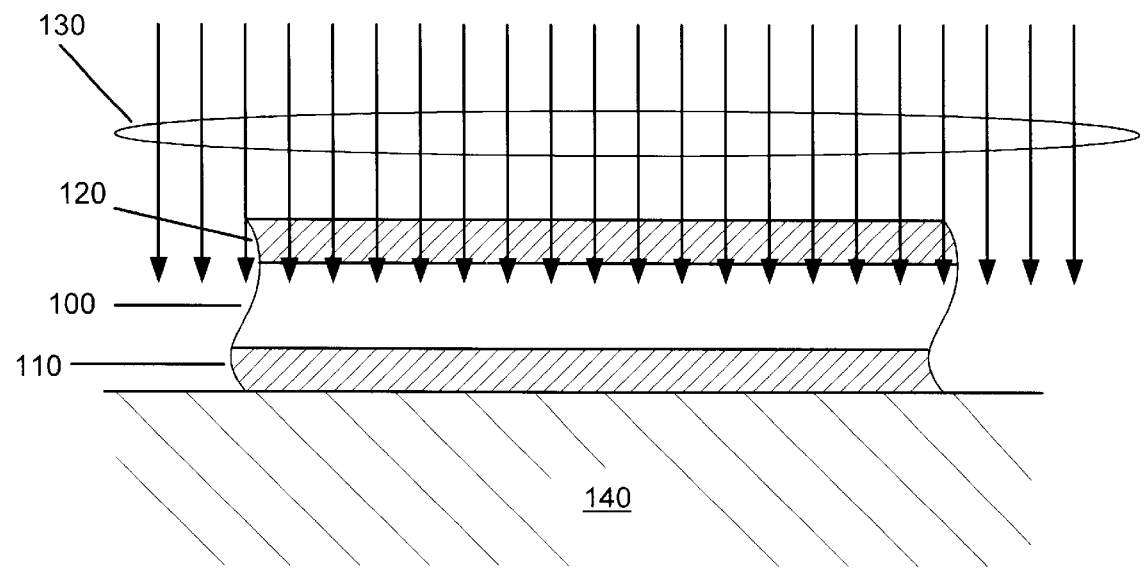
FIG. 1. shows the method and device of the present invention for an embodiment involving a simple capacitor.

FIG. 1 shows a basic embodiment of the present invention, for the case of a parallel plate capacitor. The capacitor device has gone through its standard manufacturing process to substantial completion. This process depends on where the capacitor is being located, and what role the capacitor plays. Most usually it is a capacitor in a Si based integrated circuit, such as a digital signal processor. But from the point of view of the present invention this is not important. What matters, is that the capacitor is substantially manufactured to completion, and it incorporates the high k dielectric insulator 100, which is in a crystalline, most likely poly-crystalline material state. The deposition of the high k dielectric is done by standard means, such as Chemical Vapor Deposition (CVD), Metallo Organic Chemical Vapor Deposition (MOCVD), sputtering, or by any other known mean. The crystalline high k dielectric can withstand the high temperature, typically in the 800 to 1000° C. range, involved in Si integrated circuit fabrication. The capacitor rests on a substrate 140, which can be silicon, some passive layer on top of silicon, or a completely different material, such as a III–V semiconductor. Only a representative part of the capacitor is shown in cross section, with electrodes 110 and 120 covering the dielectric from above and below. The implant is shown schematically as arrows 130, indicating a likely direction that the ion species are impinging from. The electric properties of the ion species are not important. The selection is based on being able to deliver the needed dose to the right place, namely into the insulator. Choosing the proper dose with the proper energy and the proper ion, one can convert just the desired fraction of the crystalline material into an amorphous one. The implant on its way, of course, penetrates through the top electrode, and whatever layer happens to be in addition already on top the capacitor. (No such layer is shown in FIG. 1.) This is not a problem since with the tuning of the implant species, energy, and dose, the amorphizing effect can be precisely directed to the proper place. In some cases, it is desirable to fully convert the crystalline material to the amorphous state. In this case the fraction of amorphous material is 1, and the dielectric of the capacitor has substantially the same value as the insulator material in its amorphous state. In general most applications can be satisfied if the fraction of crystalline material converted into the amorphous state is between 0.01 and 1, with a preferred range being between about 0.5 and 0.99.

The insulator of a capacitor has to have other properties that are adequate for operation besides the dielectric constant. Such a parameter is the leakage current that the insulator allows to parasitically pass from one electrode to the other. It was shown experimentally that the ion implantation for these perovskite high k materials actually improves the leakage current for a wide range of parameter choices.

During the testing phase of the invention BSTO was prepared in thin layer form at thicknesses varying from 4 to 100 nm. Typically 30 nm BSTO was used as this thickness is a prime candidate for the capacitor storage node in a DRAM. While MOCVD with a substrate temperature of about 640° C. was used for depositing these layers, sputtered films could also have been used. The 30 nm layer was deposited on Pt electrodes which were previously deposited on oxidized silicon wafers. In some cases prior to the deposition of the Pt, the oxidized silicon substrate had various layers pre-deposited for use as diffusion barriers, adhesion enhancers, and other intermediate layers. The basic capacitor sandwich structure is completed by depositing a counter electrode, also called a top electrode. Other conducting electrodes such as Ir, Au, PtO, IrO were also used. The area of the capacitor was varied by varying the dimensions of the top electrode. This could be accomplished over wide ranges, typically from about $10^{-8}$ to $2.5 \times 10^{-2}$ cm$^2$ area. Typical electrical properties measured included capacitance as a function of area, frequency, temperature and voltage, and leakage current as a function of time, frequency, voltage, temperature and area. Capacitance density defined as capacitance per unit area in units of fF/um$^2$ is the principal measurement used in this embodiment. The dielectric constant of the perovskite film is also be given, and is simply related to the capacitance density by C/A=e/t where e is the material dielectric constant and t is the thickness of the dielectric. The electrical properties in the un-implanted state were measured to be: C/A=92 fF/um$^2$ for a thickness of 30 nm of BSTO. This corresponds to a dielectric of about 312. Leakage was only at $5 \times 10^{-9}$ A/cm$^2$. For typical DRAM application this is quite acceptable leakage level. Successful operation can be achieved at about $2 \times 10^{-7}$ A/cm$^2$ level. The capacitor was then implanted with $5 \times 10^{14}$ Cr atoms/cm$^2$, up to a total concentration of 0.06 atomic %. Capacitance density dropped to 31 fF/um$^2$, corresponding to a dielectric constant of 106. Leakage remained good at $2 \times 10^{-8}$ A/cm$^2$ measured at 1V. Using twice the dosage corresponding to concentration of 0.12 atomic %, resulted in a capacitance density of about 16 corresponding to a dielectric constant of about 54. Leakage was again very low at about $1.5 \times 10^{-9}$ A/cm$^2$. Using a dosage of 0.25 atomic % resulted in a C/A of about 8, corresponding to a dielectric of 27. Leakage was low at $1 \times 10^{-9}$ A/cm$^2$. The highest dosage used for the Cr doping was 0.6 atomic % and resulted in a C/A of about 5, corresponding to a dielectric constant of about 17. Leakage measured at 1V was superbly low at $7 \times 10^{-10}$ A/cm$^2$.

Thus utilizing Cr implants, control of the dielectric properties was obtained over the range of dielectrics from above 300 to about 17. Loss of charge through leakage processes is not a problem. In applications it is desirable to be able to trim the capacitance to the required value. While in a DRAM application it may be desired to have the highest C/A, applications in filters, decoupling capacitors, varactors and discrete devices may need other specific values. The dielectric tailoring was applied after the device was substantially finished, through layers deposited on top of the device. The ability to do the dielectric tailoring after the device fabrication has been essentially completed, gives a great advantage in simplifying the overall process integration.

Further control of the dielectric properties can be achieved by annealing after the implantation in oxygen atmosphere. For the dosage of 0.06 atomic %, annealing at 550° C. for 15 minutes in oxygen, a C/A of 75 was recovered corresponding to a dielectric constant of 253 with a small increase in leakage to about $5 \times 10^{-8}$ A/cm$^2$. Annealing the sample with a Cr implant of 0.12 atomic % at 550° C. for 15 minutes in oxygen resulted in a C/A of 52, corresponding to a dielectric constant of about 177, and a similar leakage to of $5 \times 10^{-8}$ A/cm$^2$. For the dosage corresponding to 0.25 atomic %, C/A of 43 and a dielectric constant of 145 was achieved along with a leakage of $6 \times 10^{-8}$ A/cm$^2$. Annealing the sample with 0.6 atomic % Cr at 550° C. for 15 minutes in oxygen, resulted in a dielectric constant of about 144 and a C/A of 42 with a leakage of $2 \times 10^{-7}$ A/cm$^2$.

Lighter, chlorine (Cl), ions were incorporated into the BSTO dielectric by implanting the Cl through the top Pt electrode at an energy 50 keV. Low dosages were used so as to only trim the resulting dielectric properties. The concentration of the Cl atoms in the BST capacitor was about 0.02 atomic %. The capacitance density achieved was 73.4 fF/um$^2$ and a leakage of $3 \times 10^{-9}$ A/cm$^2$. Annealing at 550° C. in oxygen for only 5 minutes restored the high C/A and at times resulted in a 5 to 8% increase in the capacitance compared to an un-implanted specimen. Thus, the annealing enables additional control over the dielectric properties. For some applications in the past annealing in oxygen was often necessary to get low leakage. However, using the implantation of this invention low leakage was achieved in the pre-annealed state resulting in the option of saving an expensive annealing step in the fabrication process.

Figure 2:
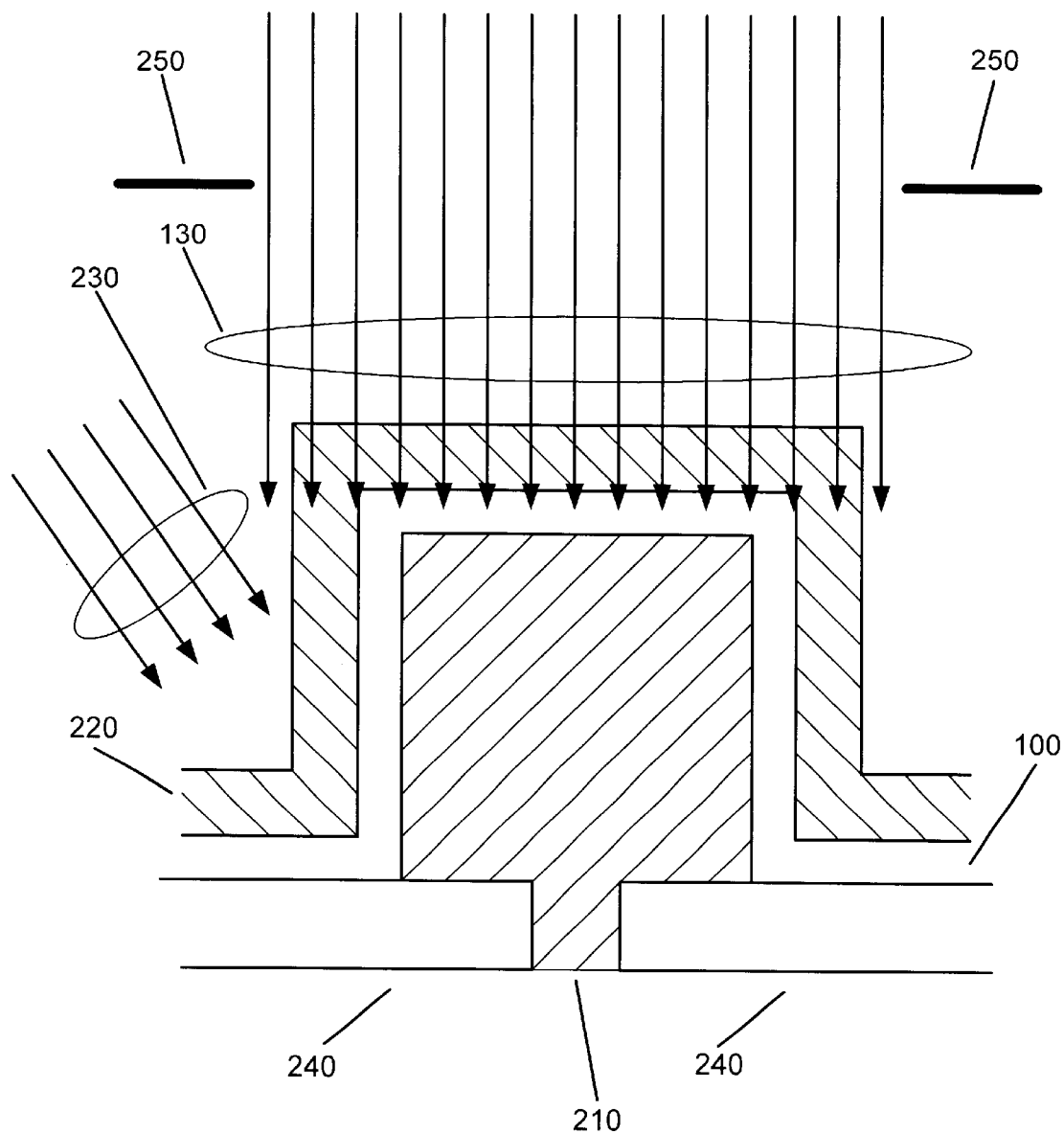
FIG. 2. shows the method and device of the present invention for an embodiment involving a stacked-capacitor.

FIG. 2 shows another embodiment of the present invention, for the case of a stacked-capacitor. Such capacitors are integral parts of some DRAMs, where the stacked-capacitor is the charge holding element. The stacked-capacitor device has gone through its standard manufacturing process to substantial completion, and it incorporates the high k dielectric insulator 100, which is in a crystalline, most likely poly-crystalline, material state before the step of the ion-implantation. In this capacitor configuration the bottom electrode 210 is actually inside the insulator 100. Another insulating layer 240, the electrical properties of which are unimportant, serves as a platform onto which the stacked-capacitor has been built. An implant is shown schematically as arrows 130, indicating a likely direction that the ion species are impinging from. The electrical properties of the ion species are not important. The species selection is based on being able to deliver the needed dose to the right place, namely into the insulator. Choosing the proper dose with the proper energy and the proper ion one can convert just the desired fraction of the crystalline material into an amorphous one. The implant on its way penetrates through the top electrode and whatever layer happens to be in addition already on top the capacitor. (No such layer is shown in FIG. 2.) It is possible that in some cases the crystalline material is fully converted to amorphous state. FIG. 2 also shows a mask 250, since most likely such a capacitor is integrated into a larger array and probably surrounded by other electric components. With such a masking one can avoid the possibility of implant damage to the other components. It is notable that one can vary the implant direction. An angled implant 230 is shown on FIG. 2. With angled implants one can tailor the properties of the insulator in the sidewall. Also, it is important that the amorphizing implant can also be used to relieve stress and strain, especially in the corners, between the various layers of the structure.

Figure 3:
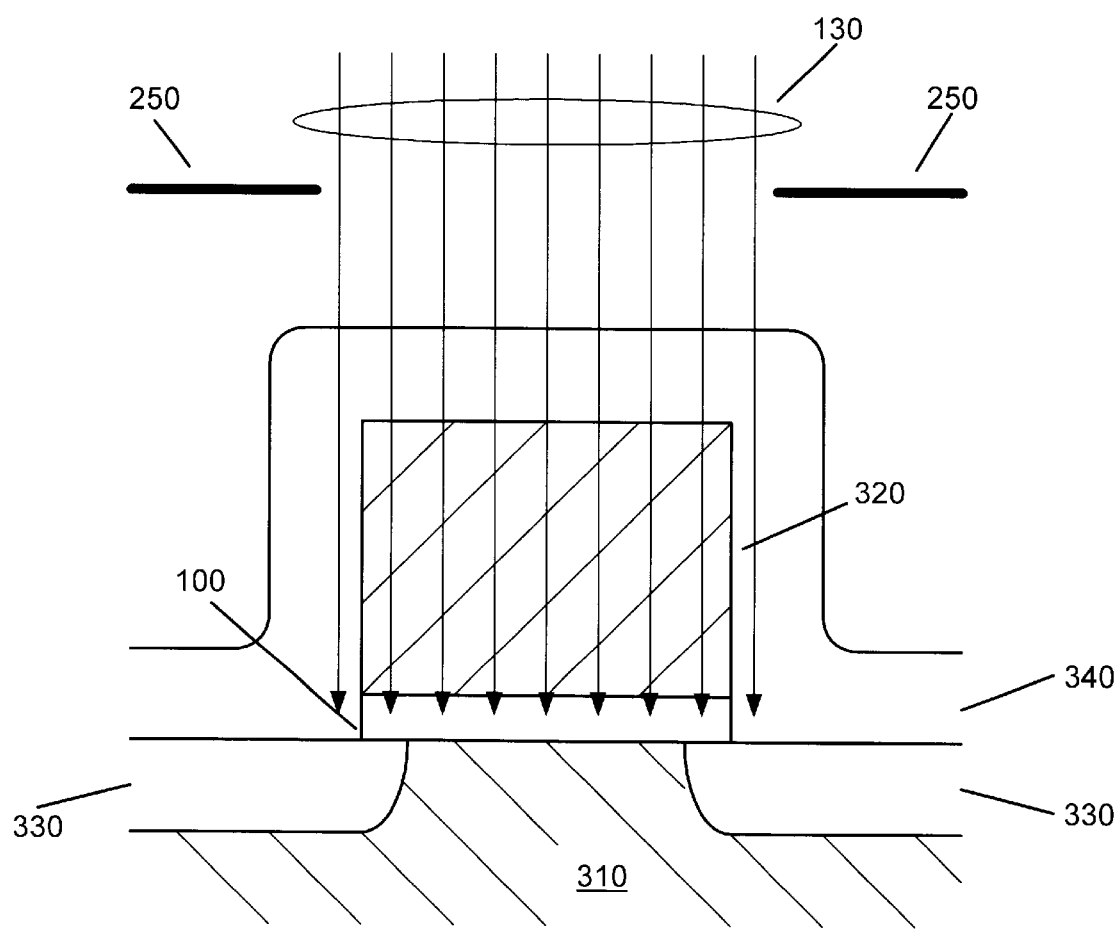
FIG. 3. shows the method and device of the present invention for an embodiment involving a field effect transistor.

FIG. 3 shows a FET device in cross section. The high k, as deposited crystalline, insulator forms the gate insulator 100. The FET is built on a Si substrate 310. However the substrate material is not essential to the invention. It could be another semiconductor, or another insulator, which would be the case for silicon-on-insulator (SOI) technology. The source and drain 330 and 340 junctions are shown for orientation purposes. The gate 320 is one of the electrodes of the gate insulator. The gate material can be any conductor. In case of Si chip technology the gates are usually a stack of polysilicon and a silicide. This is again not important from the present invention point of view, accordingly the gate is shown only schematically. An insulating, so called passivation layer 340 covering the whole structure is shown since this is usually present in FET manufacturing. The implant, shown with arrows 130, penetrated the top layers and converts a desired fraction of the gate insulator into an amorphous state. In this manner the gate has the optimally chosen dielectric constant for its functionality. The implant is again shown to impinge through a mask 250.

Experiments were carried out on structures showing similarities with key features of FETs. A cross section of a capacitor structure has been constructed on a layer of thermal SiO$_2$ which has been grown on a silicon wafer. The capacitor base electrode is Pt which is 100 nm thick. The capacitor dielectric in this example is 30 nm of BSTO. A top electrode of Pt at 70 nm thickness is then used to complete the capacitor. The capacitor is coated with 450 nm of an insulator, in this case TEOS. Such layers are commonly used in the semiconductor field for passivation and separation of wiring levels. A via is cut to the Pt top electrode and an Al contact is made. Al—Cu, Cu alone or W could also be used. Several implantation procedures are possible in this case, e.g., implantation is made after the via is established but before the metal contact is made. Part or all of the metal contact can also be made and implantation through the metal as described above can then proceed. This has the advantage of being able to adjust the depth of the implantation without changing accelerator voltage. It also aids in passivating the device. With part or all of the Al contact in place the device can be first tested and its electrical properties adjusted to the required values by a subsequent implantation.

Figure 4:
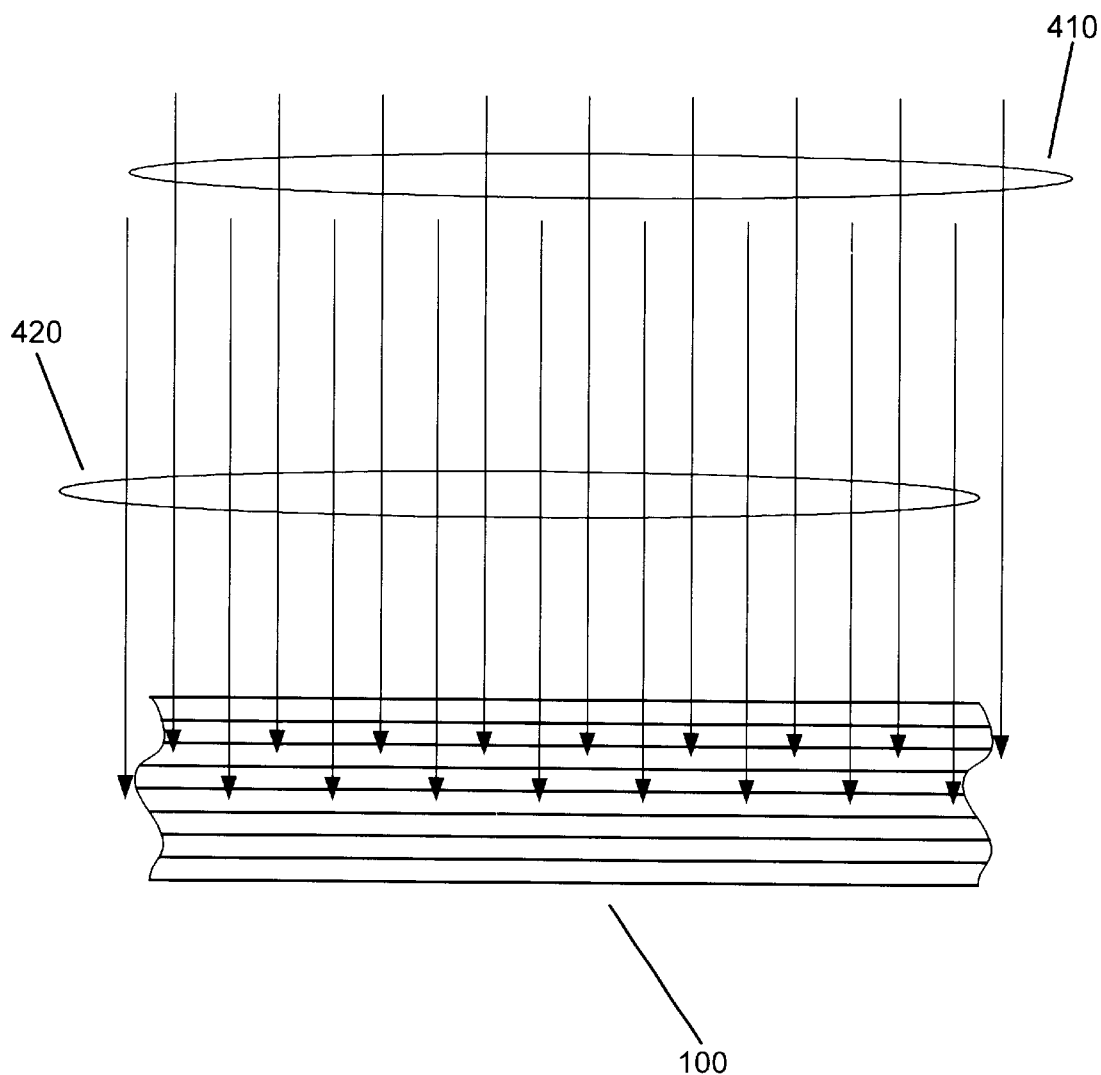
FIG. 4. shows the method and device of the present invention for an embodiment involving a dielectric mirror, or filter.

FIG. 4 shows the implanting process in the fabrication of an optical device, a dielectric mirror or filter. Such devices base their operation on layers of dielectrics each with precisely tuned dielectric constants. In this invention the filter or mirror is made out of crystalline high k material 100. The fine tuning of the dielectric constant in the depth profile of the device is accomplished not by using different dielectric materials as is the present state of the art, but by using ion implantation 410 and 420 to convert the appropriate fraction of material into the amorphous state. To accomplish this aim one might chose to use several different implants, illustrated in the figure by two different sets of arrows 420 and 430. The implants might differ from each other in energy, in implanted species, implant direction, etc. The final product behaves at a certain wavelength as filter, or as mirror, depending on the precise selection of the dielectric constants in the depth profile. In FIG. 4 the layers in the device 100 are not meant to indicate varying materials, only varying dielectric constants resulting from the various implantations.

Figure 5:
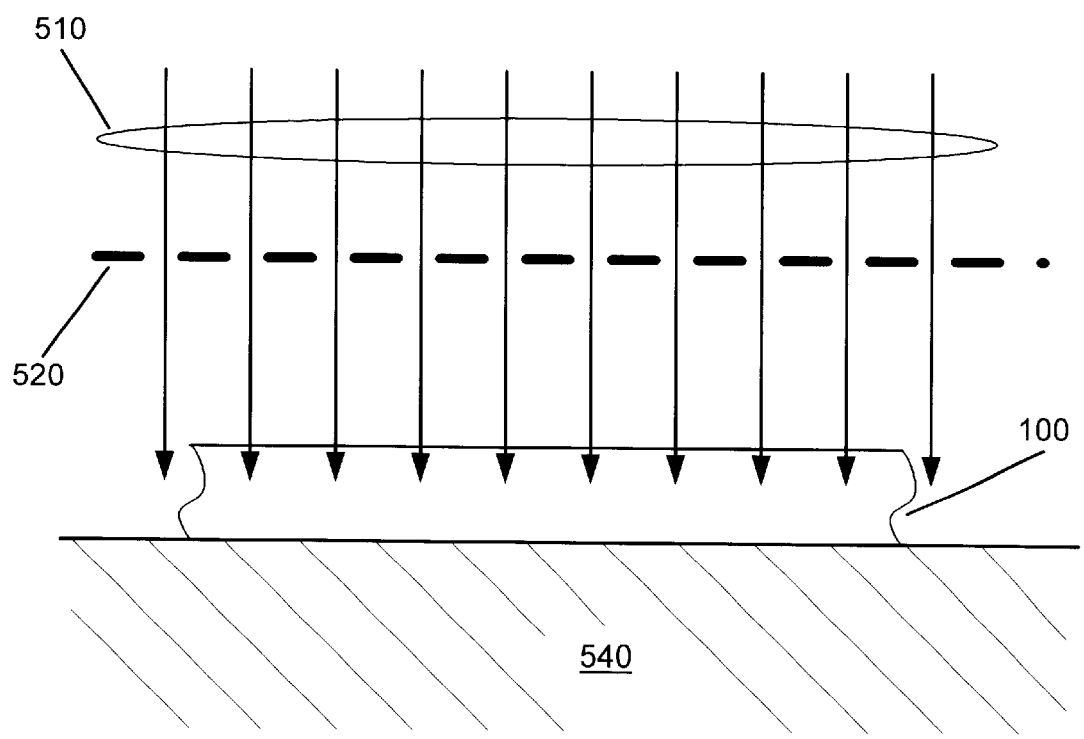
FIG. 5. shows the method and device of the present invention for an embodiment involving a dielectric grating.

FIG. 5 shows the implantation process in the fabrication of yet another optical device, a dielectric grating. Such devices base their operation on varying dielectric constants along lines, or other shapes, in a plane. The grating, as fabricated up to the implanting step, is just a smooth high k dielectric layer 100, on some sort of support backing 540. By implanting 510 with an appropriate spatial periodicity the high k material turns partly or fully amorphous in the right places, resulting in the desired optical effect. One way to accomplish spatial periodicity of the implant is with a mask 520.

Many modifications and variations of the present invention are possible in light of the above teachings, and could be apparent for those skilled in the art. The scope of the invention is defined by the appended claims.

We claim:

1. A method for tailoring properties of an insulator, comprising the steps of:
    substantially completing the manufacture of a device, wherein the device comprise the insulator, and wherein the insulator is formed of a crystalline material; and
    converting a fraction of the crystalline material of the insulator into an amorphous material by ion implanting the insulator comprised in the device.

2. The method of claim 1, wherein the step of converting by ion implanting includes a choice of parameters for the ion implanting in a manner that the tailored properties of the insulator match operational requirements of the device.

3. The method of claim 2, wherein the step of substantially completing the manufacture of the device includes the step of forming an electrical device.

4. The method of claim 3, wherein the electrical device is embedded in an integrated circuit.

5. The method of claim 4, wherein the electrical device is a capacitor, and wherein a dielectric layer between capacitor electrodes comprise the fractionally amorphous insulator.

6. The method of claim 5, wherein the step of ion implanting is executed through the top electrode of the capacitor.

7. The method of claim 5, wherein the fraction of amorphous matter in the insulator is essentially 1.

8. The method of claim 4, wherein the electrical device is a field effect transistor, and wherein a gate dielectric comprise the fractionally amorphous insulator.

9. The method of claim 8, wherein the step of ion implanting is executed through a gate electrode of the transistor.

10. The method of claim 8, wherein the fraction of amorphous matter in the insulator is essentially 1.

11. The method of claim 4, wherein the electrical device is a stacked-capacitor, and wherein a dielectric layer between stacked-capacitor electrodes comprise the fractionally amorphous insulator.

12. The method of claim 11, wherein the fraction of amorphous matter in the insulator is essentially 1.

13. The method of claim 11, wherein the ion implantation provides a strain relief between the stacked-capacitor electrodes and the insulator.

14. The method of claim 2, wherein the step of substantially completing the manufacture of the device includes the step of forming an optical device.

15. The method of claim 14, wherein the optical device is a dielectric mirror, and wherein dielectric layers of the dielectric mirror comprise a plurality of layers of the fractionally amorphous insulator.

16. The method of claim 14, wherein the optical device is a dielectric filter, and wherein dielectric layers of the dielectric filter comprise a plurality of layers of the fractionally amorphous insulator.

17. The method of claim 14, wherein the optical device is a dielectric grating, and wherein a dielectric layer of the dielectric grating comprise a layer of the fractionally amorphous insulator.

18. The method of claim 1, wherein the tailored properties of the insulator comprise a dielectric constant.

19. The method of claim 18, wherein the dielectric constant ranges between the dielectric constant of the crystalline material and the dielectric constant of the amorphous material, exhibiting a substantially linear relationship with the fraction of the amorphous material present in the insulator.

20. The method of claim 1, wherein the tailored properties of the insulator comprise a leakage current.

21. The method of claim 1, wherein tailoring properties of the insulator comprise decreasing a level of strain in the insulator.

22. The method of claim 1, wherein the fraction of the crystalline material converted into the amorphous material is in the range of about 0.01 to 1.

23. The method of claim 22, wherein the fraction of the crystalline material converted into the amorphous material is in the range of about 0.5 to 0.99.

24. The method of claim 1, wherein the step of ion implanting includes the step of using a mask.

25. The method of claim 1 further comprising the step of annealing the device.

26. The method of claim 1, further including the step of selecting the insulator to be a perovskite material.

27. A method for tailoring properties of a perovskite for matching operational requirements of a device, comprising the steps of:
    substantially completing the manufacture of the device, wherein the device comprise the perovskite, and wherein the perovskite is formed of a crystalline material; and
    converting a fraction of the crystalline material of the perovskite into an amorphous material by ion implanting the perovskite comprised in the device, and wherein the fraction of the crystalline material converted into the amorphous material is in the range of about 0.01 to 1.

28. The method of claim 27, wherein the step of converting by ion implanting includes a choice of parameters for the ion implanting in a manner that the tailored properties of the perovskite match operational requirements of the device.

29. The method of claim 28, wherein the step of substantially completing the manufacture of the device includes the step of forming an electrical device.

30. The method of claim 29, wherein the electrical device is embedded in an integrated circuit.

31. The method of claim 30, wherein the electrical device is a capacitor, and wherein a dielectric layer between capacitor electrodes comprise the fractionally amorphous perovskite.

32. The method of claim 31, wherein the step of ion implanting is executed through the top electrode of the capacitor.

33. The method of claim 31, wherein the fraction of amorphous matter in the perovskite is essentially 1.

34. The method of claim 31, further comprising the step of annealing the capacitor in an oxygen atmosphere up to a temperature of 600° C.

35. The method of claim 30, wherein the electrical device is a stacked-capacitor, and wherein a dielectric layer between stacked-capacitor electrodes comprise the fractionally amorphous perovskite.

36. The method of claim 35, wherein the fraction of amorphous matter in the perovskite is essentially 1.

37. The method of claim 35, wherein the ion implantation provides a strain relief between the stacked-capacitor electrodes and the perovskite.

38. The method of claim 30, wherein the electrical device is a field effect transistor, and wherein a gate dielectric comprise the fractionally amorphous perovskite.

39. The method of claim 38, wherein the step of ion implanting is executed through a gate electrode of the transistor.

40. The method of claim 38, wherein the fraction of amorphous matter in the perovskite is essentially 1.

41. The method of claim 38, further comprising the step of annealing the transistor in an oxygen atmosphere up to a temperature of 600° C.

42. The method of claim 29, wherein the step of substantially completing the manufacture of the device includes the step of forming an optical device.

43. The method of claim 42, wherein the optical device is a dielectric mirror, and wherein dielectric layers of the dielectric mirror comprise a plurality of layers of the fractionally amorphous perovskite.

44. The method of claim 42, wherein the optical device is a dielectric filter, and wherein dielectric layers of the dielectric filter comprise a plurality of layers of the fractionally amorphous perovskite.

45. The method of claim 42, wherein the optical device is a dielectric grating, and wherein layer of the dielectric grating comprise a layer of the fractionally amorphous perovskite.

46. The method of claim 37, wherein the tailored properties of the perovskite comprise a dielectric constant.

47. The method of claim 46, wherein the dielectric constant ranges between the dielectric constant of the crystalline material and the dielectric constant of the amorphous material, exhibiting a substantially linear relationship with the fraction of the amorphous material present in the perovskite.

48. The method of claim 37, wherein the tailored properties of the perovskite comprise a leakage current.

49. The method of claim 29, wherein tailoring properties of the perovskite comprise decreasing a level of strain in the perovskite.

50. The method of claim 27, wherein the fraction of the crystalline material converted into the amorphous material is in the range of about 0.5 to 0.99.

51. The method of claim 27, wherein the step of ion implanting includes the step of using a mask.

52. The method of claim 27, wherein in the step of converting by ion implanting, ion species are chosen from the group consisting of Mn, Cr, Cl, Nb, Ti, F, H and D.

53. The method of claim 27 further comprising the step of annealing the device.

* * * * *